US007071846B2

(12) United States Patent
Moerz

(10) Patent No.: US 7,071,846 B2
(45) Date of Patent: Jul. 4, 2006

(54) ANALOG DECODING METHOD AND DECODER

(75) Inventor: Matthias Moerz, Munich (DE)

(73) Assignee: Lucent Technologies Inc., Murray Hill, NJ (US)

( * ) Notice: Subject to any disclaimer, the term of this patent is extended or adjusted under 35 U.S.C. 154(b) by 30 days.

(21) Appl. No.: 10/784,814

(22) Filed: Feb. 24, 2004

(65) Prior Publication Data

US 2005/0184892 A1    Aug. 25, 2005

(51) Int. Cl.
*H03M 7/00* (2006.01)

(52) U.S. Cl. .......................... 341/50; 341/51

(58) Field of Classification Search ............ 341/50, 341/59, 60, 51, 52; 714/776, 786, 792, 116, 714/186, 192; 386/33, 34

See application file for complete search history.

(56) References Cited

U.S. PATENT DOCUMENTS

| 4,593,267 | A  | * | 6/1986 | Kuroda et al. ............. 341/67 |
| 6,577,462 | B1 | * | 6/2003 | Hamada et al. ............ 360/51 |
| 6,633,329 | B1 | * | 10/2003 | Janko et al. .............. 348/180 |
| 2004/0071218 | A1 | * | 4/2004 | Seo ..................... 375/240.25 |

FOREIGN PATENT DOCUMENTS

DE        197 25 275 A1    12/1998

OTHER PUBLICATIONS

Bickerstaff et al., "A 24 Mb/s Radix-4 LogMAP Turbo Decoder for 3GPP-HSDPA Mobile Wireless", Feb. 11, 2003, pp. 1-3.

Vienblat, "Analog Convolutional Decoder, Project Thesis", May 2002.

F. Lustenberger, M. Helfenstein, H.-A. Loeliger, F. Tarkoy, and G. S. Moschytz, "All-Analog Decoder for a Binary (18,9,5) Tail-Biting Trellis Code," in *Proc. of 25th European Solid-State Circuits Conference*, Duitsburg, Germany, pp. 362-365, Sep. 1999.

M. Moerz, T. Gabara, R. Yan, and J. Hagenauer, "An Analog 0.25 μm BiCMOS Tailbiting MAP Decoder," in *Proc. IEEE International Solid-State Circuits Conference* (ISSCC 2000), San Francisco, California, pp. 356-357, Feb. 2000.

C. Winstead, J. Dai, W. J. Kim, S. Little, Y.B., Kim, C. Myers, C. Schlegel, "Analog MAP Decoder For (8.4) Hamming Code In Subthreshold CMOS," in *Proc. Advanced Research in VLSI*, Salt Lake City, Nevada, pp. 132-147, Mar. 2001.

(Continued)

*Primary Examiner*—Peguy JeanPierre

(57) ABSTRACT

An analog decoder includes a controller and an analog decoder core. The analog decoder core has an input of an input length that is less than a code length of the code data. If only a single analog decoder core is implemented, then the controller applies a portion of the code data to the analog decoder core prior to each of a plurality of read operations in which decoded data is read from the analog decoder core. Alternatively, if a plurality of analog decoder cores is implemented, then the controller may apply a portion of code data onto each of the analog decoder cores prior to a single read operation associated with each of the analog decoder cores.

18 Claims, 7 Drawing Sheets

OTHER PUBLICATIONS

V. Gaudet and G. Gulak, "A 13.3Mb/s 0.35 μm CMOS Analog Turbo Decoder IC With A Configurable Interleaver," in *Proc. IEEE International Solid-State Circuits Conference (ISSCC 2003)*, San Francisco, California, Feb. 2003.

M. Moerz, "Analog Sliding Window Decoding," in *Proc. Joint Workshop of Communications and Coding*, Barolo, Italy, Nov. 2002.

L.R. Bahl, J. Cocke, F. Jelinek and J. Raviv, "Optimal Decoding of Linear Codes for Minimizing Symbol Error Rate," *IEEE Trans. Inform. Theory*, vol. IT-20, pp. 284-287, Mar. 1974.

J. Hagenauer, E. Offer, and L. Papke, "Iterative Decoding of Binary Block and Convolutional Codes," *IEEE Trans. Inform. Theory*, vol. 42, No. 2, pp. 429-445, Mar. 1996.

J. B. Anderson and S. M. Hladik, "Tailbiting MAP Decoders," *IEEE Journal on Selected Areas in Communications*, vol. 16, No. 2, pp. 297-302, Feb. 1998.

A. J. Viterbi, "An Intuitive Justification and a Simplified Version of the MAP Decoder for Convolutional Codes," *IEEE Journal on Selected Areas in Communications*, vol. 16, No. 2, pp. 260-264, Feb. 1998.

S. Benedetto, D. Divsalar, G. Montorsi, and F. Pollara, "Soft-Output Decoding Algorithms for Continuous Decoding of Parallel Concatenated Convolutional Codes," in *Proc. ICC 96*, vol. 1, pp. 112-117, 1996.

European Telecommunications Standards Institute, "Universal Mobile Telecommunications System (UMTS): Multiplexing and Channel Coding (FDD)," SGPP TS 125.212 version 3.4.0, pp. 14-20, Sep. 2000.

* cited by examiner

ANALOG DECODING METHOD AND DECODER

BACKGROUND OF THE INVENTION

1. Field of the Invention

The present invention relates in general to an analog decoding method and decoder.

2. Description of Related Art

Channel coding is used in many communication systems. As a general trend, encoding techniques become more complex to facilitate a variety of desirable applications, such as high speed downlink packet access (for example). It is therefore necessary to provide appropriate decoding hardware.

A channel decoder is commonly implemented in the digital domain. There are two types of digital decoders. The first digital decoder implements an optimal decoding technique (or "APP" decoding) in which symbol error probability is minimized. The APP decoder for a trellis code performs a forward (or "alpha") recursion starting at the beginning of the code block (code trellis) and a backward (or "beta") recursion starting at the end of the code block (code trellis). The decoder output is calculated based on the results of the two recursions.

The second digital decoder implements a suboptimal decoding technique (or "sliding window" decoding). The sliding window decoder performs the same basic operations as the APP decoder, however, the sliding window decoder works on sub-blocks (or windows) of the overall code block. Since the backward recursion starts at the end of a window (rather than the end of the overall code block), a stabilization length is necessary (so that the backward recursion closely approximates the true values) before the decoder output can be calculated. As compared to an APP decoder, the sliding window decoder reduces both decoding delay and storage requirements.

Decoding solutions have also been implemented in the analog domain. Known analog decoders have a tailbiting structure in which the beginning and the end of the code trellis are connected together. These existing decoder implementations build the complete code trellis with analog circuitry. That is, the ring size of the analog decoder is equal to the overall block length of the code to be decoded. The applied signals travel around the tailbiting trellis freely until a stable state is reached.

Although conventional decoders are generally thought to be acceptable, they are not without shortcomings. For example, the analog decoder outperforms the digital decoders, and would therefore seem to be an ideal candidate for high speed applications. However, the complexity of the analog circuit grows linearly with the block length of the code since the whole code trellis is mapped onto the analog circuit. Thus, the analog decoder has been limited to applications involving relatively short and simple codes. Another problem is that a particular analog decoder can only be used for a fixed coding scheme (i.e., block length, rate, memory, and interleaver).

SUMMARY OF THE INVENTION

The present invention provides an analog decoder that implements a fraction of the overall block length of the code trellis and thus significantly reduces circuit complexity. Furthermore, a single decoder core may be used for various block lengths.

In one exemplary embodiment, the analog decoder includes a controller and an analog decoder core. The analog decoder core has an input with an input length that is shorter than a code length of the code data. The controller performs an apply operation prior to a plurality of read operations. In so doing, the controller applies a portion of the code data to the analog decoder core, then reads decoded data from the analog decoder core, then applies another portion of the code data (updated code data) to the analog decoder core. The updated code data overwrites code data previously applied.

In another exemplary embodiment, the analog decoder includes a controller and a plurality of analog decoder cores. Here, each of the analog decoder cores has an input with an input length that is shorter than a code length of the code data. The controller applies a portion of the code data to each of the analog decoder cores. The controller then reads decoded data from each of the analog decoder cores. The decoded data read from each of the analog decoder cores is based on different portions of the applied code data. In this way, the decoding process may be carried out in parallel.

BRIEF DESCRIPTION OF THE DRAWINGS

The present invention will become more fully understood from the detailed description below and the accompanying drawings, wherein like elements are represented by like reference numerals, which are given by way of illustration only and thus are not limiting of the present invention and wherein.

DETAILED DESCRIPTION OF EMBODIMENTS

To facilitate understanding of the present invention, the following description is presented in three sections. Section I discusses two conventional decoding techniques inclusive of (A) a posteriori probability ("APP") decoding and (B) sliding window decoding. Section II presents a generalized sliding window decoding technique as applied to (A) terminated convolutional codes and (B) tailbiting convolution codes, and in subpart (C) introduces a tailbiting trellis structure. Section III presents two exemplary, non-limiting embodiments of the invention inclusive of (A) a single core—iterative decoding embodiment and (B) a multiple core—parallel decoding embodiment.

Unless otherwise stated, sections I, II, and III are discussed in view of the following considerations: a rate 1/2 convolutional encoder with memory m and constraint length m+1, where N info bits are encoded into a code word of length 2N; and the trellis of the code is terminated using 2 m additional bits. Typically (but certainly not in all cases), the termination of the code is implemented by starting the encoder in the all zero state and ending the encoder in the all zero state.

I. Conventional Decoding of Convolutional Codes:

The APP and sliding window decoding techniques are well known in this art, and therefore only a brief description of each technique is provided.

A. APP Decoding:

APP decoding, which is also known as the BCJR algorithm, may be considered as an "optimal" technique for decoding convolutional codes since it minimizes the symbol error probability.

The decoder output for an info bit at an instant in time is given in terms of a log-likelihood ratio. And, for a memoryless transmission channel (for example), independent variables inclusive of $\alpha$ values and $\beta$ values can be defined and used to determine the log-likelihood ratios. The $\alpha$ values are calculated in a forward recursion starting from the beginning of the trellis, while the $\beta$ values are calculated in a backward recursion starting from the end of the trellis.

If it is assumed that the encoder starts in the all zero state and also ends in the all zero state due to the termination of the code, then the $\alpha$ and the $\beta$ recursions may be initialized with $\alpha_0(0)=1$ and $\beta_{N+m}(0)=1$. That is, both recursions may be initialized with 100% certainty since (due to the code trellis being terminated) information is known about the distribution of the initial $\alpha$ and $\beta$ values at the beginning and end, respectively, of the code trellis.

Figure 5:
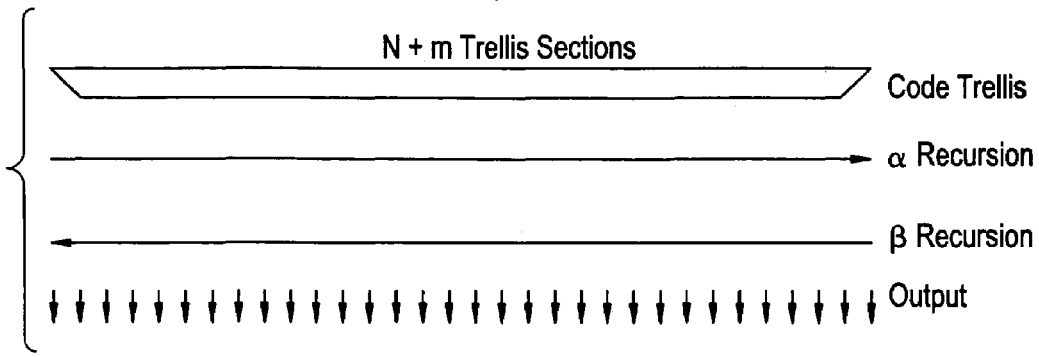
FIG. 5 is a schematic illustrations of a conventional APP decoding technique for a terminated convolutional code.

The $\alpha$ and $\beta$ recursions are schematically illustrated in FIG. 5. As shown in FIG. 5, the $\alpha$ recursion can start immediately after the first channel values are received. However, the $\beta$ recursion, and therefore the calculation of the decoder output, must be delayed until the whole block of 2(N+m) channel values has been received.

On the one hand, the APP decoding technique algorithm generally provides superior performance in terms of output accuracy. On the other hand, it introduces a considerable amount of decoding delay when the block size of the code is large. Furthermore, the sequence of all channel values and $\alpha$ values needs to be stored along the trellis, which consumes a significant amount of memory.

Figure 6:
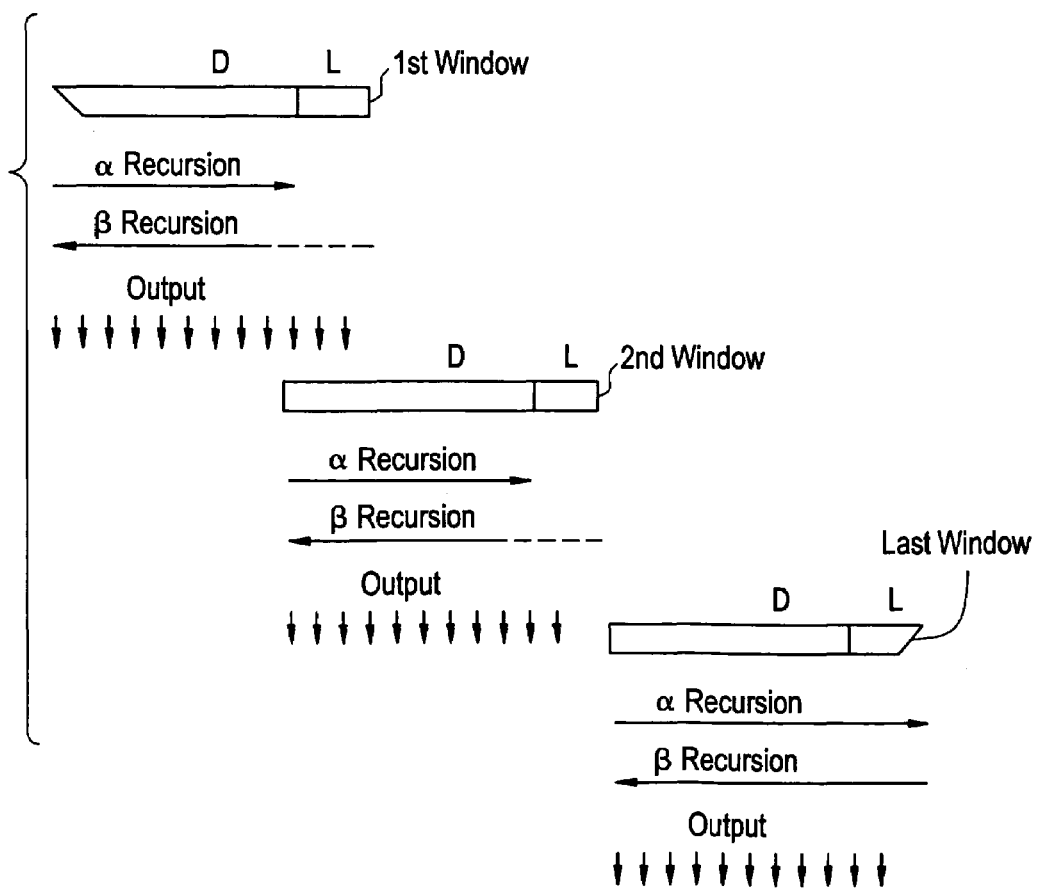
FIG. 6 is a schematic illustration of a conventional sliding window decoding technique for a terminated convolutional code.

B. Sliding Window Decoding:

The sliding window technique, which has conventionally been implemented using a digital decoder core, reduces decoding delay and storage requirements. With reference to FIG. 6, the sliding window technique involves dividing the overall code block into smaller sub-blocks (or windows). Each window may have a length of W trellis sections that is significantly smaller than the N trellis sections.

As shown in FIG. 6, the $\alpha$ recursion starts from the beginning of the trellis (i.e., the first trellis section of the first window), while the $\beta$ recursion starts from the last trellis section of the first window. Thus, the $\beta$ recursion may begin earlier, as compared to that of the APP technique described above.

The $\alpha$ recursion may be initialized with 100% certainty due the code being terminated, as discussed above with respect to the APP decoding technique. However, the $\beta$ recursion can not be initialized with 100% certainty due to a lack of information about the distribution of the $\beta$ values at the end of the first window. Conventionally, therefore, the $\beta$ recursion is initialized (albeit with some uncertainty) using a uniform distribution (i.e., $\beta_w=(1/2^m, 1/2^m, \ldots 1/2^m)$) or setting $\beta_w=\alpha_w$. Notwithstanding the uncertainty of the $\beta$ recursion initialization, it is well known in this art that the backward recursion closely approximates the exact $\beta$ distribution after a stabilization length L of five to six times the constraint length of the code.

Once the first window has been decoded, the decoder window is shifted by D trellis sections to decode the next widow. In so doing, the last $\alpha$ value from the previous window is propagated into the new window to continue the forward recursion in the new window. The $\beta$ recursion is performed using uncertain initialization values and a stabilization length L, as described with respect to the first window.

The advantages of the sliding window technique are that the decoder output can be calculated for D=W−L trellis sections (info bits) within each window, thereby reducing decoding delay significantly for large overall code block lengths. Further, the channel values need to be stored for only a single window, and the $\alpha$ values need to be stored for only D trellis sections, thereby decreasing memory usage significantly. However, these advantages are achieved at the expense of computational overhead introduced by the additional stabilization length L required for the $\beta$ recursion within each window.

It will be appreciated that the conventional sliding window algorithm requires a stabilization length only for the $\beta$ recursion, while the $\alpha$ recursion is calculated exactly as in the APP decoder. That is, the $\alpha$ recursion does not require a stabilization length L due to the known distribution of the $\alpha$ values at the beginning of the trellis.

II. Generalized Sliding Window Decoding Technique:

A. Applied to Terminated Codes:

The sliding window idea may be generalized and applied to a situation that presents an arbitrary window of W trellis sections. The window is characterized as "arbitrary" because no information is available about the distribution of the $\alpha$ values at the beginning of the window (or the $\beta$ values at the end of the window). Due to the lack of such information, a stabilization length of L trellis sections is necessary for both the forward and the backward recursions.

Figure 7:
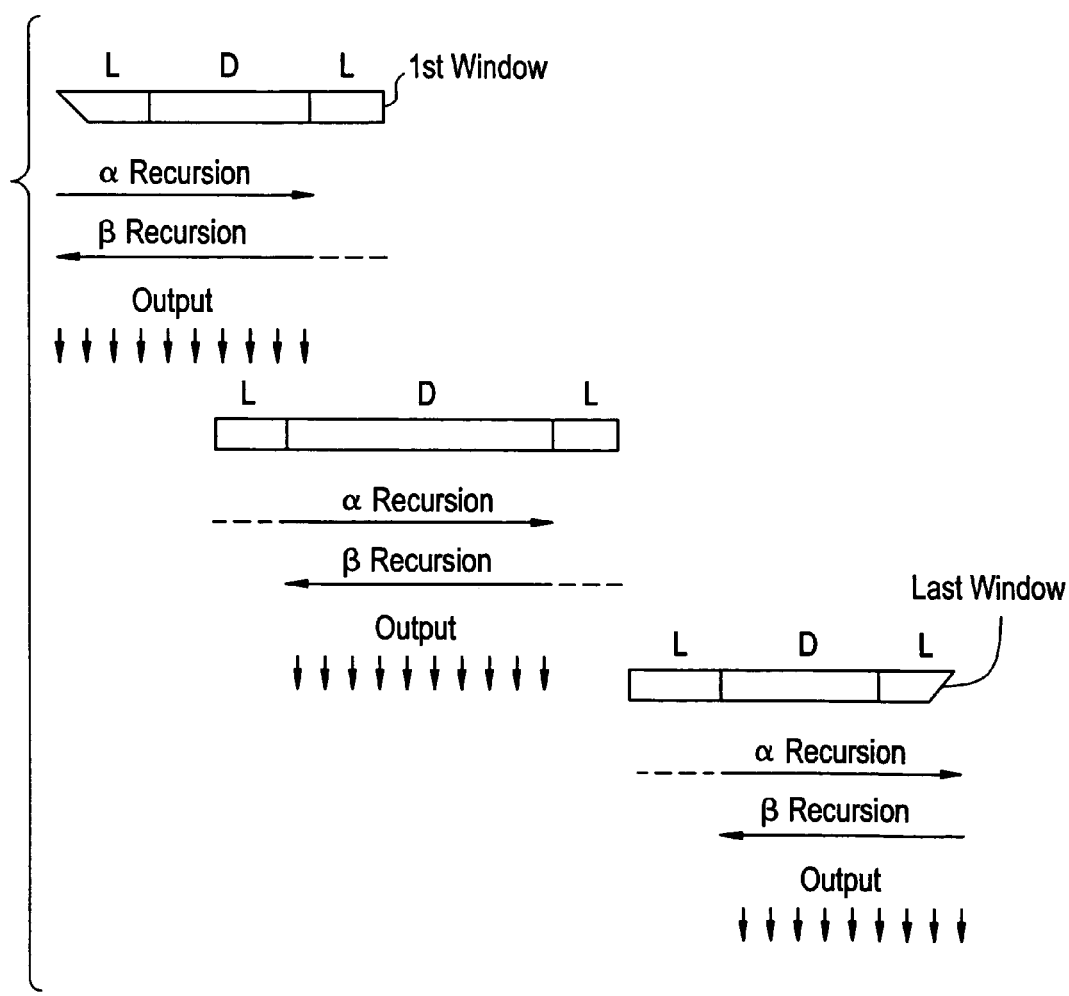
FIG. 7 is a schematic illustration of a generalized sliding window decoding technique as applied to an arbitrary window of a terminated convolutional code.

With reference to FIG. 7, the two stabilization lengths result in D=W−2L trellis sections (info bits) being decoded within each window. However, there are two exceptions. Namely, the first window and the last window may decode D+L trellis sections (info bits), as shown in FIG. 7. This is because each of the first and the last windows require only one stabilization length L due to the known distributions $\alpha_0(0)=1$ at the beginning of the trellis and $\beta_{N+m}(0)=1$ at the end of the trellis. Again, the distributions at the beginning and the end of the trellis are known by virtue of the code being terminated.

B. Applied to Tailbiting Codes:

It is well known in this art that the generalized sliding window decoding technique can be used to perform suboptimal APP decoding of tailbiting convolutional codes. APP decoding of tailbiting convolutional codes is roughly $2^m$ times more complex than APP decoding of terminated codes.

In a tailbiting code, the state at the beginning and the end of the trellis is not necessarily the first (all zero) state. Instead, any state is possible with the only constraint being that the first and the last state in the trellis is the same for all code words in the set. An advantage of tailbiting codes is that no termination bits are required (and therefore no rate loss occurs) and all code bits are protected equally, which is not the case in a truncated code trellis.

Typically, the block length of a tailbiting code is rather small compared to the window size of a sliding window decoder. So for the moment, consider a scenario in which one window is required to decode the overall code block. That is, assume that the length of the tailbiting trellis is $W_T=D=W-2L$.

Figure 8:
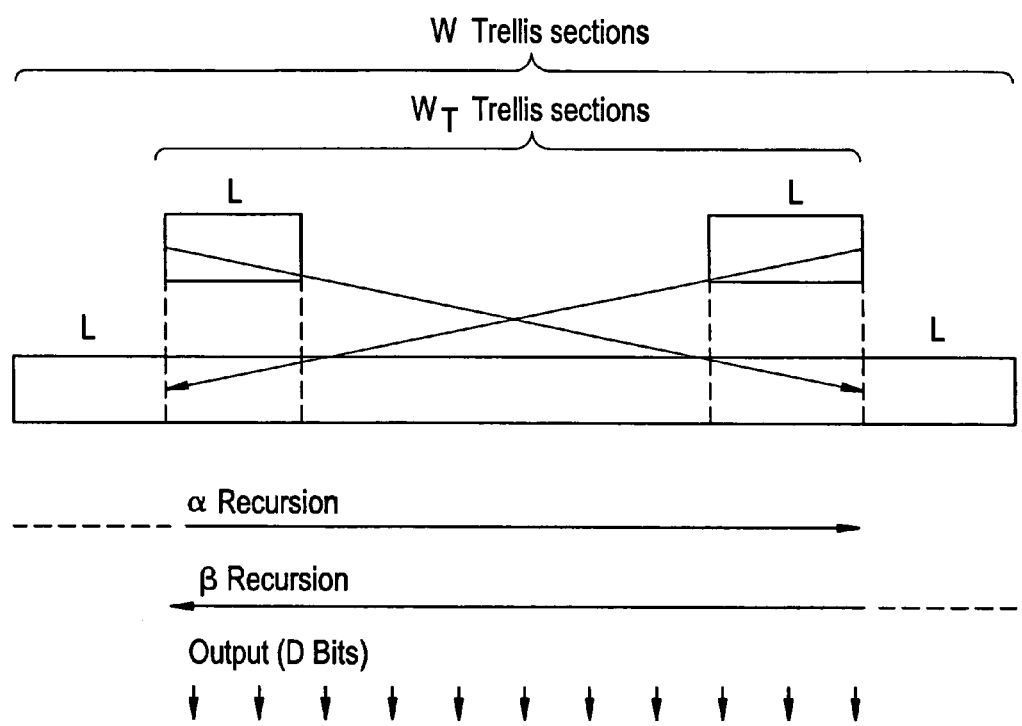
FIG. 8 is a schematic illustration of a suboptimal APP decoding technique as applied to a tailbiting convolutional code.

With reference to FIG. 8, the overall decoding window of size W is obtained by adding the first L trellis sections of the tailbiting code to the end of the trellis, and adding the last L trellis sections of the tailbiting code to the beginning of the trellis. These additional trellis sections (at the beginning and the end of the tailbiting code) provide the necessary stabilization lengths of L trellis sections for both the forward and the backward recursions. The recursions are initialized, for example, with a uniform distribution (i.e., $\alpha_0=\beta_w=(1/2^m, 1/2^m, \ldots 1/2^m)$), and the overall block of D trellis sections (info bits) can be decoded.

Figure 9:
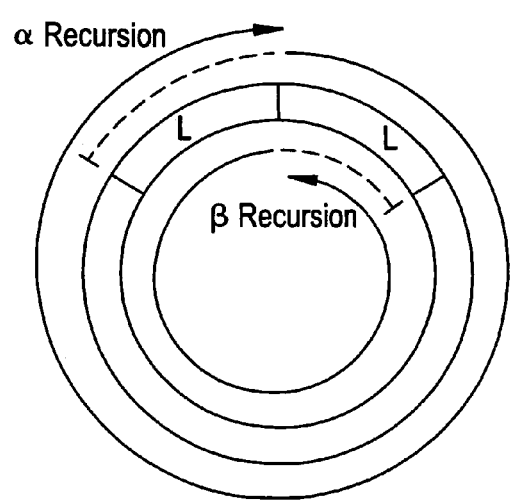
FIG. 9 is a schematic illustration of circular trellis structure in which the beginning and the end of the code trellis are connected together.

C. The Tailbiting Trellis Structure:

Instead of using a window of size W (as shown in FIG. 8), an equivalent smaller circular trellis structure of size $W_T=D=W-2L$ could be used, as shown in FIG. 9. In the ring structure shown in FIG. 9, the beginning and the end of the trellis are connected together, thereby forming a "tailbiting" trellis. By virtue of the tailbiting trellis, the required stabilization lengths at the beginning and the ends of the window are automatically provided. The recursions are now performed on the tailbiting trellis and both recursions overlap by L trellis sections.

For very short tailbiting codes in combination with a high encoder memory, the required stabilization length L (five to six times the constraint length) can be similar in size (or even bigger) as the block length of the tailbiting code, which could result in the $\alpha$ and the $\beta$ recursions wrapping several times around the tailbiting trellis. This algorithm is therefore also referred to as the wrap-around decoding algorithm.

In this art, it is conventional to use analog decoders to implement a circular (or ring shaped) trellis structure for both the forward and backward recursions. However, according to convention, the stabilization length is not limited to L trellis sections, and the recursions do not start with a uniform distribution of the $\alpha$ and the $\beta$ values. Instead, the signals travel around the tailbiting trellis freely until a stable state is reached. Thus far, existing decoder implementations build the complete code trellis with analog circuitry. This prohibits the building of decoders for larger and therefore more interesting codes since complexity, and similarly the chip size, grow linearly with the block length.

III. The Analog Sliding Window Decoder:

From a structural standpoint, the analog sliding window decoder of the present invention employs the ring structure of a conventional, analog tailbiting convolutional decoder. However, in contrast to conventional wisdom, only a fraction (i.e., a window of size W trellis sections) of the overall N trellis sections is implemented. This is advantageous in terms of circuit complexity and/or decoding speed, especially for those codes (either terminated or tailbiting) with large block lengths.

As discussed above, unless otherwise stated, the description is based on the following considerations: a rate 1/2 convolutional encoder with memory m and constraint length m+1, where N info bits are encoded into a code word of length 2N; and the trellis of the code is terminated using 2 m additional bits.

Figure 1:
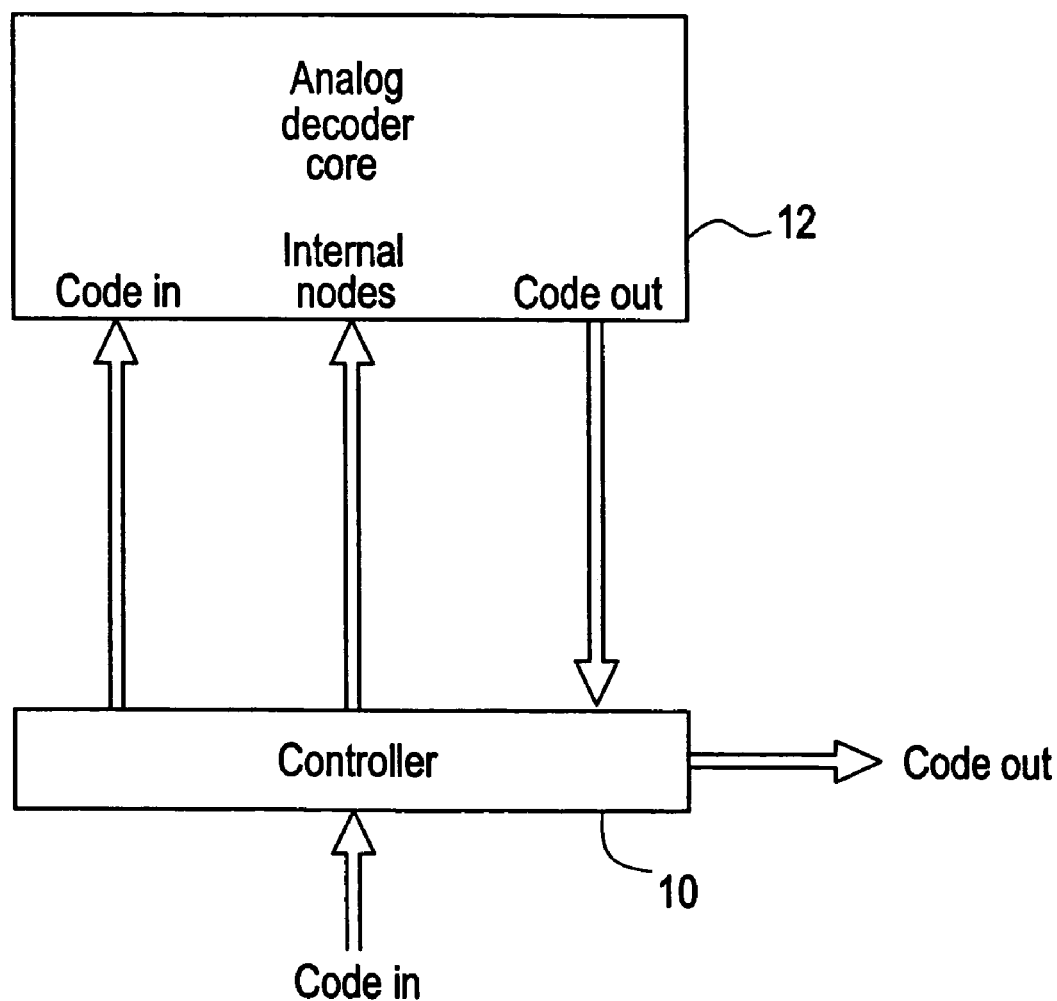
FIG. 1 is a schematic illustration of an analog decoder according to an exemplary embodiment of the present invention.

A. Single Core Embodiment:

FIG. 1 illustrates an exemplary, non-limiting embodiment of the invention. Here, the analog decoder is schematically shown as having a controller 10 and a single analog decoder core 12. The controller 10 is operatively connected to inputs (labeled "code in") and outputs (labeled "code out") of the analog decoder core 12. Optionally, the controller may also be connected to internal nodes of the analog decoder core.

The physical connections between the controller and the analog decoder core may be provided via pins, wirings, and/or conductive line. However, many alternative connections will be readily apparent from this description, and therefore a detailed description of the same is omitted.

It will be appreciated that the controller 10 and the analog decoder core 12 may be physically implemented as a single component (e.g., a single chip) or a plurality of separate and distinct components.

Figure 2:
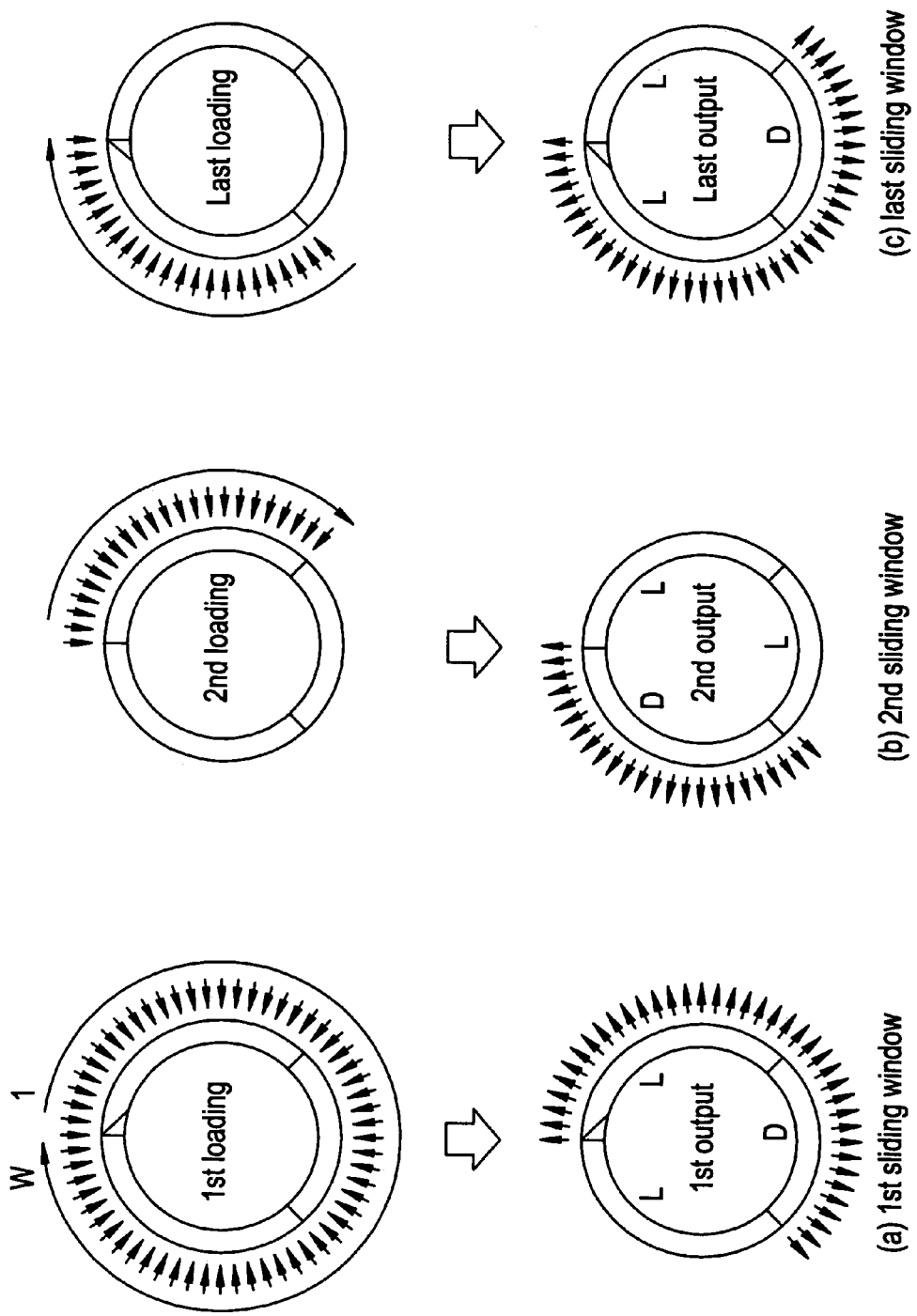
FIGS. 2a–c is a schematic illustration of the decoding technique for a terminated convolutional code performed by the analog decoder depicted in FIG. 1.

The functioning of the decoder core will be appreciated with reference to FIGS. 2(*a*)–2(*c*), which provide a graphical representation of the analog decoder core 12 using a conventional diagramming technique. According to this convention, the circle itself represents the circuit implementation of a tailbiting trellis structure, and points on the circle (i.e., the portions of the circle at the heads of the radial inwardly directed arrows or the portions of the circle at the tails of the radial outwardly directed arrows) represent the inputs and outputs of the circuit. Thus, in discussing the application of data to or reading data from the analog decoder core 12, a direction (e.g., clockwise) may be given to provide an indication of the inputs and outputs being accessed by the controller 10.

Assume that $D=L=W/3$, where D is a decoding length, L is a stabilization length, and W is the total input length (window size) of the analog decoder core 12. It is to be appreciated that L is set equal to D for ease of exposition, but the invention is not so limited. For example, L may be set less than (or greater than) D.

Initially, as shown in the upper part of FIG. 2(*a*), the controller 10 applies channel values corresponding to the first W trellis sections of the code. The channel values 1 to W are applied via the inputs "code in" of the analog decoder core 12.

Since the code is terminated, the controller 10 now controls the forward recursion in a way that it starts in a known state (e.g., the all-zero state). This initialization may be implemented, for example, via the controller applying appropriate values to the internal nodes of the decoder core. Alternatively, the initialization may be achieved via the controller 10 applying a set of values to the inputs "code in" before applying the channel values 1 to W.

After a settling time of the analog decoder core 12, and with reference to the lower part of FIG. 2(*a*), the controller 10 reads out (via the outputs "code out") the first W–L decoded information bits from the analog decoder core 12. Typically, only $D=W-2L$ information bits would be read out from the analog decoder core 12. However, when initialized, W–L values may be read out.

FIG. 2(*b*) depicts the decoding of the second window. The upper part of FIG. 2(*b*) shows the controller 10 applying channel values corresponding to the next $D=W-2L$ trellis sections of the code. The channel values are applied clockwise in a way that the D sections of the analog decoder core 12 are overwritten starting where the previous apply operation left off.

After the settling time of the analog decoder core 12, and with reference to the lower part of FIG. 2(*b*), the controller 10 reads out another D decoded information bits from the analog decoder core 12. It will be appreciated that the analog decoder core output is read out L sections behind the updated analog decoder core input, which (as shown in FIGS. 2(a)–2(c)) progresses in the clockwise direction. This staggered output is attributable to the stabilization length L of the backward recursion using the updated decoder input. The decoding process continues in this way until the end of the overall code block is reached.

FIG. 2(c) depicts the decoding of the last window, where the end of the terminated code has been reached. For ease of exposition, but not as a limitation of the invention, it is assumed that the block length is a multiple of the decoding width D (and D=L).

As shown in the upper part of FIG. 2(c), the channel values corresponding to the last D=W−2L trellis sections of the code are applied to the analog decoder core 12. Here, the controller 10 initializes the backward recursion so that it starts in the last encoder state (e.g., the all-zero state). This initialization may be implemented by the controller in a fashion similar to that noted above with respect to the forward recursion initialization.

As a result of the initialization, after the settling time of the decoder core, and with reference to the lower part of FIG. 2(c), the controller 10 reads out the remaining D+L decoded information bits from the analog decoder core 12. The last L information bits may be read out since no stabilization length is required for the backward recursion at the end of the code block due the termination of the code and due to the initialization of the analog decoder core 12.

It will be appreciated that analog sliding window decoding of a tailbiting convolution code works similarly. However, no initialization is required and a stabilization length will be necessary at the beginning and the end of trellis.

Figure 3:
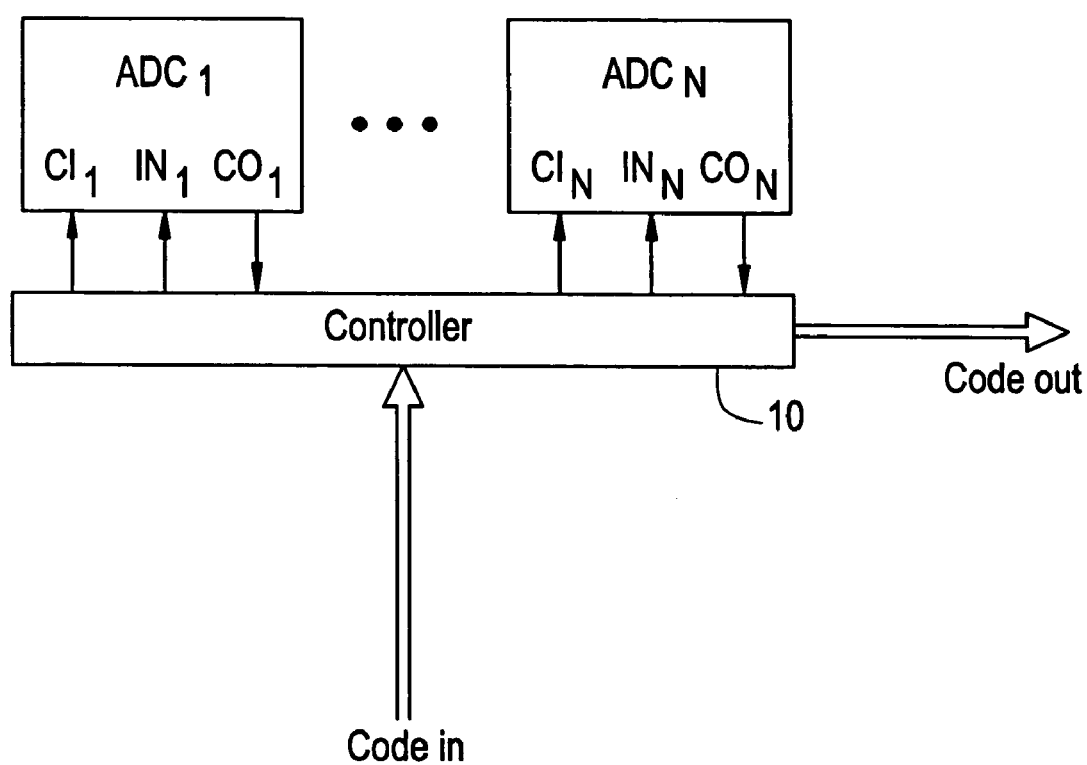
FIG. 3 is a schematic illustration of an analog decoder according to another exemplary embodiment of the present invention.

B. Multiple Core Embodiment—Parallel Decoding:

FIG. 3 illustrates another exemplary, non-limiting embodiment of the invention. Here, the analog decoder is schematically shown as having a controller 10 and a plurality of analog decoder cores $ADC_{1 \ldots N}$. The controller 10 is operatively connected to inputs $CI_{1 \ldots N}$ and outputs $CO_{1 \ldots N}$ of the analog decoder cores $ADC_{1 \ldots N}$. Optionally, the controller 10 may also be connected to internal nodes $IN_{1 \ldots N}$ of the analog decoder cores $ADC_{1 \ldots N}$.

As in the previous embodiment, the physical connections between the controller 10 and the analog decoder cores may be provided via pins, wirings, and/or conductive lines. However, many alternative connections are well known in this art, and therefore a detailed description of the same is omitted. Further, the controller 10 and the analog decoder cores may be physically implemented as a single component (e.g., single chip) or a plurality of separate and distinct components.

Figure 4:
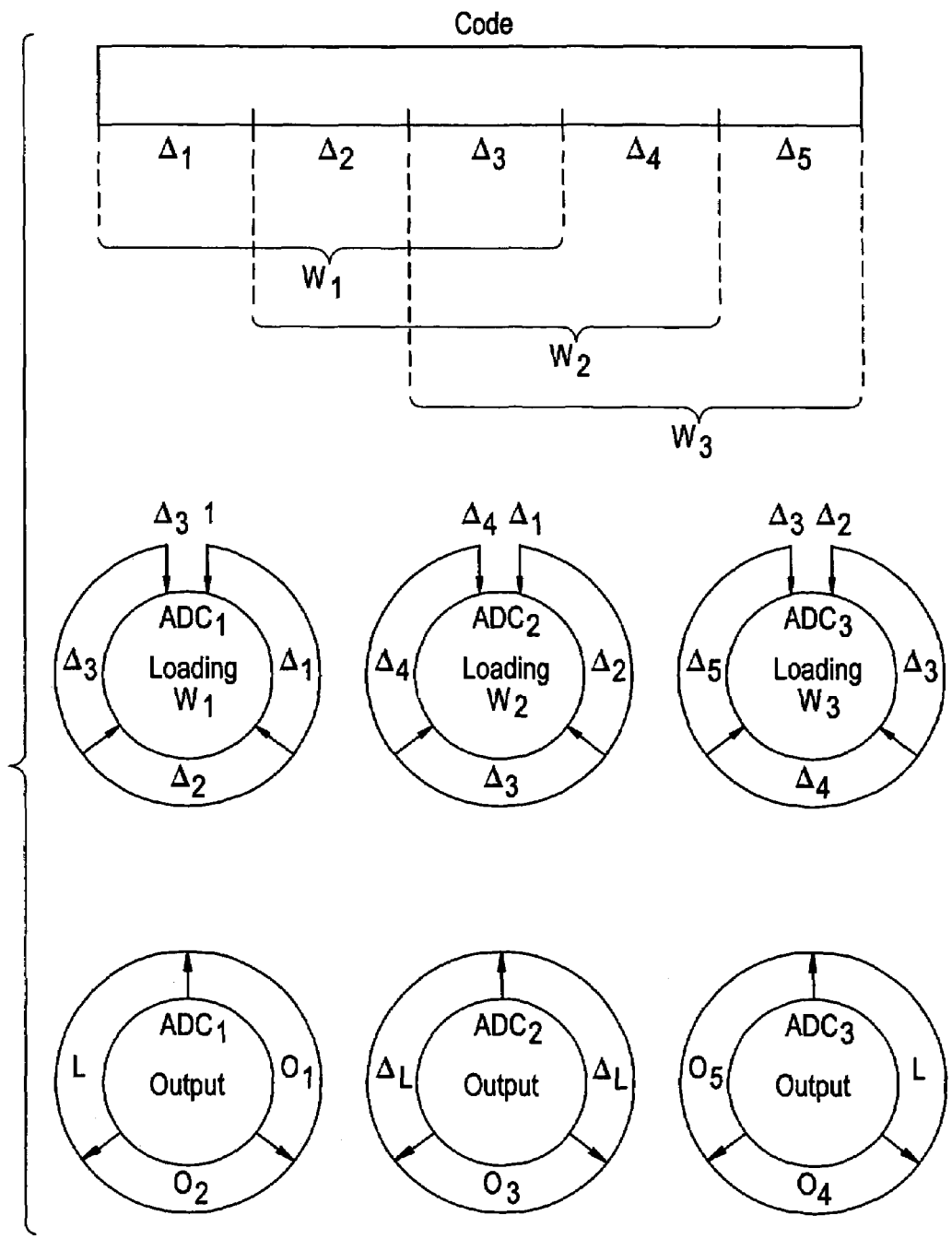
FIG. 4 is a schematic illustration of a parallel decoding technique for a terminated convolutional code performed by the analog decoder depicted in FIG. 3.

The functioning of the analog decoder cores will be appreciated with reference to FIG. 4. Here, as in the first embodiment, assume that a terminated convolutional code is to be decoded. Also assume that D=L=W/3. For ease of exposition, assume that that the block length is a multiple of the decoding width D (and D=L). It will be appreciated, however that the invention is not so limited.

As shown in the upper most part of FIG. 4, the code has a block length that is fives times the decoding width $D=\Delta_1=\Delta_2=\Delta_3=\Delta_4=\Delta_5$.

The controller 10 loads a portion of the code data onto each of the analog decoder cores as shown in the middle part of FIG. 4. Specifically, with respect to the analog decoder core $ADC_1$, the controller 10 applies channel values corresponding to the $\Delta_1$, $\Delta_2$ and $\Delta_3$ trellis sections of the code. With respect to the analog decoder core $ADC_2$, the controller 10 applies channel values corresponding to the $\Delta_2$, $\Delta_3$ and $\Delta_4$ trellis sections of the code. And with respect to the analog decoder core $ADC_3$, the controller 10 applies channel values corresponding to the $\Delta_3$, $\Delta_4$ and $\Delta_5$ trellis sections of the code. All of the channel values are applied via the inputs $CI_{1 \ldots N}$ of the respective analog decoder cores $ADC_{1 \ldots N}$ in a clockwise direction.

Since the code is terminated, the controller 10 controls the forward recursion of the analog decoder core $ADC_1$ in a way that it starts in a known first state (e.g., the all-zero state). This initialization may be implemented, for example, via the controller 10 applying appropriate values to the internal nodes $IN_1$ of the analog decoder core $ADC_1$. Alternatively, the initialization may be achieved via the controller 10 applying a set of values to the inputs $CI_1$ before applying the channel values 1 to $\Delta_3$. Also, the controller 10 initializes the backward recursion of the analog decoder core $ADC_3$ so that it starts in the last encoder state (i.e., the all-zero state). This initialization may be implemented by the controller 10 in a fashion similar to that noted above with respect to the forward recursion initialization.

After a settling time of the decoder cores, the controller 10 reads out (via the outputs $CO_{1 \ldots N}$) decoded information $O_1$–$O_5$ from the analog decoder cores as shown in the lower part of FIG. 4. Specifically, the controller 10 reads out the first W−L decoded information bits from the decoder core $ADC_1$. As in the previous embodiment, the first L ($\Delta_1$) information bits may be read out since no stabilization length is required for the forward recursion at the beginning of the code block due to the initialization of the analog decoder core $ADC_1$. Thus, the decoder output $O_1$–$O_2$ is based on the input of the $\Delta_1$, through $\Delta_3$ trellis sections of the code.

The controller 10 also reads out D=W−2L decoded information bits from the decoder core $ADC_2$. Here, both the forward and the backward recursions require a stabilization length L. Thus, the analog decoder core output $O_3$ is based on the input of the $\Delta_2$ through $\Delta_4$ trellis sections of the code.

The controller 10 also reads out the last D+L decoded information bits from the decoder core $ADC_3$. The last L ($\Delta_5$) information bits may be read out since no stabilization length is required for the backward recursion at the end of the code block due the termination of the code and due to the initialization of the analog decoder core $ADC_3$. Thus, the analog decoder core output $O_4$–$O_5$ is based on the input of the $\Delta_3$ through the $\Delta_5$ trellis sections of the code.

It will be appreciated that analog sliding window decoding of a tailbiting convolution code works similarly. However, no initialization is required and a stabilization length will be necessary at the beginning and the end of trellis.

Numerous features of the invention including various and novel details of construction and combination of parts have been particularly described with reference to the accompanying drawings and pointed out in the claims. It will be understood that the particular analog sliding window decoding core and decoding method embodying the invention is shown by way of illustration only and not as a limitations of the invention. The principles and features of this invention may be employed in varied and numerous embodiments without departing from the scope of the invention.

I claim:

1. A decoding method, comprising:
applying a portion of code data to an analog decoder core prior to each of a plurality of read operations in which decoded data is read from the analog decoder core, the code data having a code length of bits and the analog decoder core having an input with an input length of bits that is less than the code length of bits.

2. The method of claim 1, wherein each applying step applies new code data to a different part of the input of the analog decoder core.

3. The method of claim 2, wherein the new code data applied by a subsequent applying step is shifted along the input length of the input as compared to new code data applied by a previous applying step.

4. The method of claim 3, further comprising:
reading a portion of an output of the analog decoder core after each applying step, the read portion being less than an output length of the output of the analog decoder core.

5. The method of claim 4, wherein each reading step reads decoded data from a different portion of the output of the analog decoder core.

6. The method of claim 5, wherein the decoded data read by a subsequent reading step is shifted along the output length of the output as compared to the decoded data read by a previous reading step.

7. The method of claim 6, wherein the input has corresponding inputs to the outputs of the output, and the reading step reads a portion of the output that is shifted by a fixed amount from the corresponding input to which the previous applying step applied new code data.

8. The method of claim 1, wherein an initial applying step applies new code data to the entire input length of the input.

9. The method of claim 1, wherein the applying steps subsequent to the initial applying step apply new code data to less than the entire input length of the input.

10. The method of claim 1, comprising:
reading a portion of an output of the analog decoder core after each applying step, the read portion being less than an output length of the output of the analog decoder core.

11. The method of claim 10, wherein each reading step reads decoded data from a different part of the output of the analog decoder core.

12. The method of claim 11, wherein the decoded data read by a subsequent reading step is shifted along the output length of the output as compared to the decoded data read by a previous reading step.

13. The method of claim 1, comprising:
controlling the analog decoder core to start a forward recursion and a backward recursion in an initialized state.

14. The method of claim 13, wherein the initialized state is an all zero state.

15. A decoding apparatus comprising:
an analog decoder core with an input for receiving code data, the input having an input length of bits; and
a controller that applies code data to the analog decoder core, the code data having a code length of bits that is greater than the input length of bits.

16. The apparatus of claim 15, wherein the controller applies the code data to the analog decoder core, such that previously applied code data is overwritten by updated code data.

17. The apparatus of claim 16, wherein the analog decoder core has an output from which the controller reads out decoded data; and
wherein the controller reads out decoded data from the analog decoder core before the previously applied code data is overwritten by the updated code data.

18. The apparatus of claim 15, comprising a plurality of the analog decoder cores,
wherein the controller applies a portion of the code data to each of the analog decoder cores.

* * * * *